United States Patent [19]
Wu

[11] Patent Number: 6,130,135
[45] Date of Patent: Oct. 10, 2000

[54] METHOD OF FABRICATING LIGHTLY-DOPED DRAIN TRANSISTOR HAVING INVERSE-T GATE STRUCTURE

[75] Inventor: Shye-Lin Wu, Hsinchu Hsien, Taiwan

[73] Assignee: Powerchip Semiconductor Corp., Hsin-Chu, Taiwan

[21] Appl. No.: 09/081,396

[22] Filed: May 18, 1998

[51] Int. Cl.[7] .................................................. H01L 21/336
[52] U.S. Cl. ............................................. 438/305; 438/592
[58] Field of Search .................................... 438/303, 305, 438/306, 307, 545, 592, 595, 657

[56] References Cited

U.S. PATENT DOCUMENTS

| | | | |
|---|---|---|---|
| 4,968,639 | 11/1990 | Bergonzoni | 438/305 |
| 5,219,777 | 6/1993 | Kang | 438/305 |
| 5,585,295 | 12/1996 | Wu | 438/305 |

*Primary Examiner*—Chandra Chaudhari
*Attorney, Agent, or Firm*—Ladas & Parry

[57] ABSTRACT

A method of fabricating a lightly doped drain transistor having an inverse-T gate structure. A semiconductor substrate is provided to implement said method. After a gate dielectric layer is formed on the substrate, the step of sequentially forming a first amorphous silicon layer and a second amorphous silicon layer follows. Then, the second amorphous silicon layer is patterned to form a first electrode, and first spacers are formed on sidewalls of the first electrode. Lightly-doped layers are thereafter formed in the substrate, and thus the first amorphous silicon layer is patterned to form a second electrode. Both steps make use of the first electrode and the first spacers as masking. Subsequently, second spacers are formed to overlie the first spacers and sidewalls of the second electrode. After heavily-doped layers are formed in the substrate by using the first electrode and the second spacers as masking, the lightly-doped layers are driven in so as to be fully covered by the second electrode.

20 Claims, 3 Drawing Sheets

METHOD OF FABRICATING LIGHTLY-DOPED DRAIN TRANSISTOR HAVING INVERSE-T GATE STRUCTURE

BACKGROUND OF THE INVENTION

1. Field of the Invention

The present invention in general relates to semiconductor integrated circuit fabrication. In particular, the present invention relates to a method of fabricating a lightly doped drain transistor having an inverse-T gate structure.

2. Description of the Related Arts

If device dimensions are reduced and the supply voltage remains unchanged, the electric field generated in a metal-oxide-semiconductor (MOS) transistor increases. If the electric field becomes strong enough, it can give rise to hot-carriers near the drain while operated in the saturation mode. Some of these hot carriers pass to the gate electrode and thus constitute a gate current. Some of the hot carriers inject into the gate oxide but do not reach the gate electrode, which causes trapping of the hot carriers and result in threshold voltage variation. To overcome hot-carrier degradation, lightly doped drain (LDD) structures have been proposed.

In the LDD structure, the drain is formed by two implants. One is self-aligned to the gate electrode to create lightly-doped regions, and the other is self-aligned to the gate electrode, on which oxide sidewall spacers have been formed, so as to create heavily-doped regions. Accordingly, each lightly-doped region is arranged between the associated heavily-doped region and the channel region. The purpose of the lightly-doped regions is to reduce the electric field near the drain and decrease the occurrence of hot carriers. However, because the gate electrode can not control the lightly-doped regions, which have higher parasitic resistance due to lighter dose implantation, the carrier mobility is decreased and the associated current drive is reduced.

To overcome this problem, J. E. Moon et al., "A New LDD Structure: Total Overlap with Polysilicon Spacers (TOPS)," IEEE Electron Device Letters, 11(5), 1990, pp.221–223 presents a fully overlapped lightly doped drain structure with polysilicon spacers to increase carrier mobility and thus improve the current drive capability. Nevertheless, such a TOPS device shows significant gate-induced drain leakage (GIDL). Therefore, provision of a lightly doped drain transistor is needed, the lightly-doped regions of which can be fully covered by the gate electrode so as to increase the current drive capability as well as restrain gate-induced drain leakage and prevent hot-carrier degradation.

SUMMARY OF THE INVENTION

Therefore, an object of the present invention is to provide a method of fabricating a lightly-doped drain transistor which can reduce the electric field near the drain and prevent hot-carrier degradation for device reliability.

It is another object of the present invention to provide a method of fabricating a lightly-doped drain transistor in which lightly-doped regions are fully covered by the gate electrode so as to improve current drive capability.

It is a further object of the present invention to provide a method of fabricating a lightly-doped drain transistor which can dampen gate-induced drain leakage.

The present invention achieves the above-indicated objects by providing a method of fabricating a lightly doped drain transistor. A semiconductor substrate is provided to implement said method. After a gate dielectric layer is formed on the substrate, the step of sequentially forming a first amorphous silicon layer and a second amorphous silicon layer follows. Then, the second amorphous silicon layer is patterned to form a first electrode, and first spacers are formed on the sidewalls of the first electrode. Lightly-doped layers are thereafter formed in the substrate, and thus the first amorphous silicon layer is patterned to form a second electrode. Both steps make use of the first electrode and the first spacers as masking. Subsequently, second spacers are formed to overlie the first spacers and sidewalls of the second electrode. After heavily-doped layers are formed in the substrate by using the first electrode and the second spacers as masking, the lightly-doped layers are driven in so as to be fully covered by the second electrode.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

According to the present invention, a lightly-doped drain transistor having an inverse-T gate structure is suitable for being fabricated on a semiconductor substrate 10. The semiconductor substrate 10 might be composed of silicon (Si), germanium(Ge), or gallium-arsenic(GaAs). The following preferred embodiment exemplifies a silicon substrate, but this is not intended to limit the scope of the present invention. With reference to the accompanying FIGS. 1–7, the method in accordance with the present invention will be described in detail.

Figure 1:
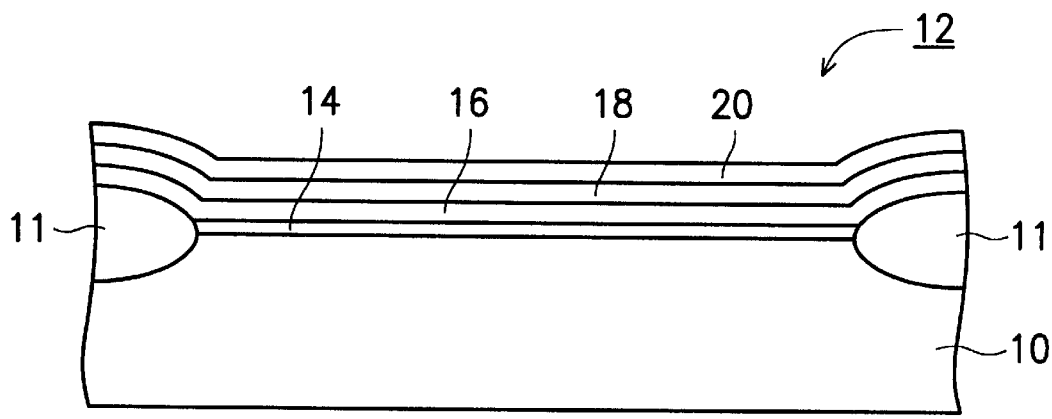
FIG. 1 schematically depicts a cross-sectional view of the step of forming three amorphous silicon layers over a semiconductor substrate.

Referring to FIG. 1, isolating structures 11 are first formed on the predetermined portion of the semiconductor substrate 10. Therefore, a device active region 12 is defined between two neighboring isolating structures 11. A gate dielectric layer 14 is formed to overlie the portion of the semiconductor substrate 10 within the scope of the device active region 12. Usually, the isolating structures 11 can be formed by either local oxidation of silicon (LOCOS) or trench-isolation processes. Preferably, the gate dielectric layer 14 is a silicon dioxide layer formed by means of a thermal oxidation process.

Moreover, as shown in FIG. 1, three amorphous silicon layers are sequentially formed over the gate dielectric layer 14. These amorphous silicon layers are named a first amorphous silicon layer 16, a second amorphous silicon layer 18, and a third amorphous silicon layer 20, respectively. Preferably, the formation of the amorphous silicon layers 16, 18, 20 is performed by means of low-pressure chemical vapor deposition (LPCVD) or plasma-enhanced chemical vapor deposition (PECVD) processes while using gas $SiH_4$ as a reactant. Each of the amorphous silicon layers 16, 18, 20 has a thickness of about 300–1500 Å. Because the amorphous silicon layers 16, 18, 20 are separately deposited by means of three deposition processes, there are layer boundaries between two neighboring amorphous silicon layers. Such layer boundaries act as the etching end points during the subsequent etching processes. Preferably, the amorphous silicon layers 18 and 20, which constitute gate electrodes, are doped with impurities to increase the conductivity thereof.

Figure 2:
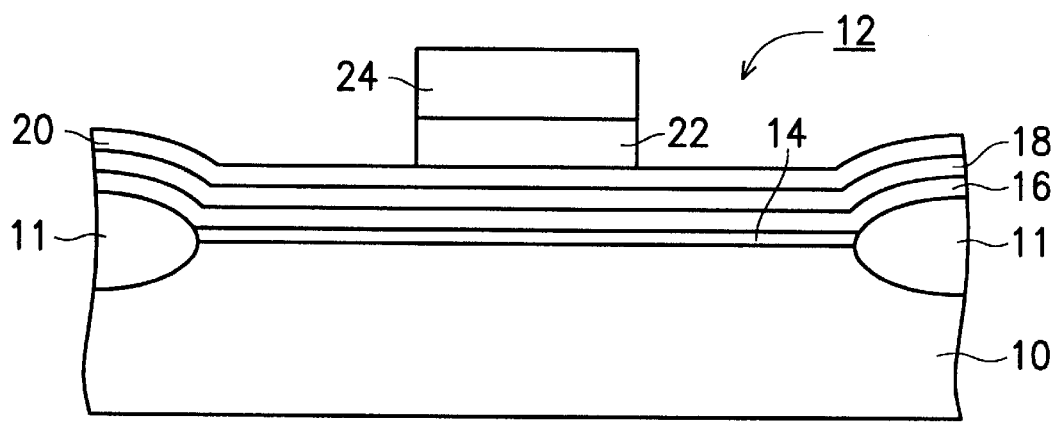
FIG. 2 schematically depicts a cross-sectional view of the step of forming a buffer layer on the amorphous silicon layer and subsequent patterning.

Next, referring to FIG. 2, a buffer layer 22 is conformably formed on the third amorphous silicon layer 20. By means of a photolithography process, a photoresist layer 24 having the pattern of a first electrode 21 (which will subsequently be described) is formed on the buffer layer 22. The photoresist layer 24 acts as a shielding mask when the buffer layer 22 is subjected to patterning and etching processes. Therefore, the portion of the buffer layer not covered by the photoresist layer 24 remains. Accordingly, the range of the patterned buffer layer 22 is almost equal to the range of the first electrode 21. Preferably, the buffer layer 22 is a tetraethyl-ortho-silicate (TEOS) oxide having a thickness of about 300–2000 Å. Generally speaking, the aforementioned photolithography process comprises several steps of photoresist coating, baking, exposure, development, and rinse, and thus forms the photoresist layer 24 on the buffer layer 22. Preferably, the step of patterning the buffer layer 22 is performed by means of reactive ion etching (RIE) processes.

Figure 3:
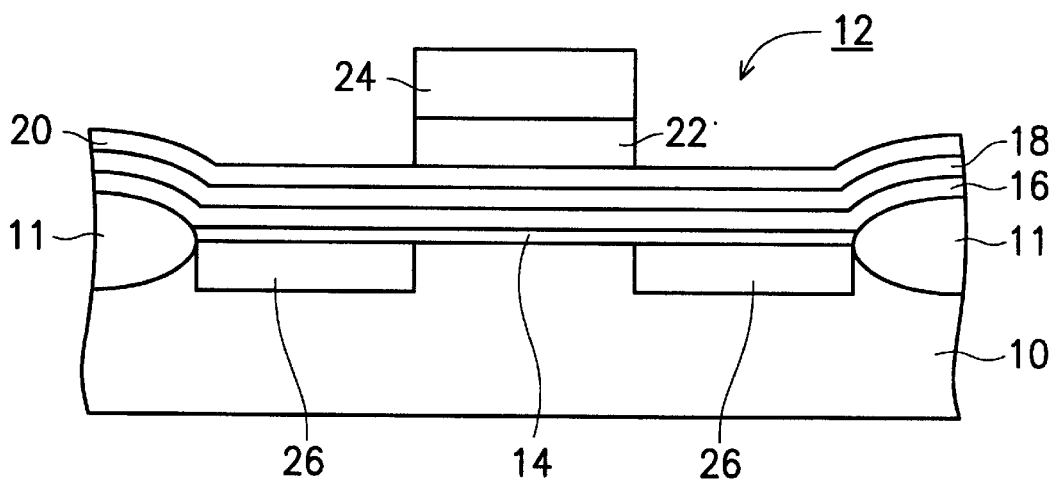
FIG. 3 schematically depicts a cross-sectional view of the step of forming anti-punchthrough layers in the substrate.

Referring to FIG. 3, a pair of anti-punchthrough layers 26 are formed in the substrate 10 by means of ion implantation while the photoresist layer 24 is utilized as a mask. Ordinarily, this step is called halo implantation. The purpose of the anti-punchthrough layers 26 is to prevent the lightly-doped layers 30 (which will subsequently be described) from coming into contact with each other by the depletion regions on account of short channal, and thus producing punchthrough breakdown. Preferably, the implant uses boron or $BF_2$ as dopant, the energy ranges from about 30 to 200 KeV, and the dosage ranges from about $1\times10^{11}$ to $5\times10^{13}$ cm$^{-2}$, while the junction depth ranges from about 0.05 µm to about 0.25 µm.

Figure 4:
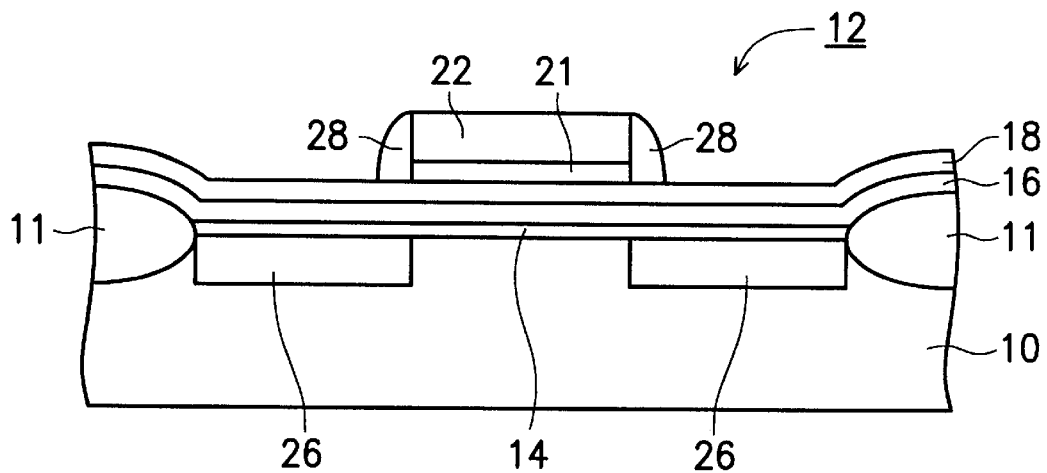
FIG. 4 schematically depicts a cross-sectional view of the steps of patterning the third amorphous silicon layer to form a first electrode and then forming first spacers on the sidewalls of the first electrode.

The photoresist layer 24 is therafter removed. As shown in FIG. 4, the third amorphous silicon layer 20 is patterned and etched to form a first electrode 21 while both the buffer layer 22 and the buffer layer 22 are utilized as a mask. Then, first spacers 28 are formed on the sidewalls of the buffer layer 22 and the first electrode 21. Preferably, the step of patterning the third amorphous silicon layer 20 to form the first electrode 21 employs the layer boundary between the second amorphous silicon layer 18 and the third amorphous silicon layer 20 as etching end points. Moreover, the formation of the first spacers 28 is implemented by first conformably forming a silicon nitride layer over the substrate 10. Accordingly, the silicon nitride layer is formed on the second amorphous silicon layer 18 and the buffer layer 22, being simultaneously formed on the a sidewalls of the buffer layer 22 and the first electrode 21. Subsequently, the silicon nitride layer is subjected to an etching back process to form the first spacers 28 which remain on the sidewalls of the buffer layer 22 and the first electrode 21. Preferably, the etching back process is implemented by reactive ion etching.

Figure 5:
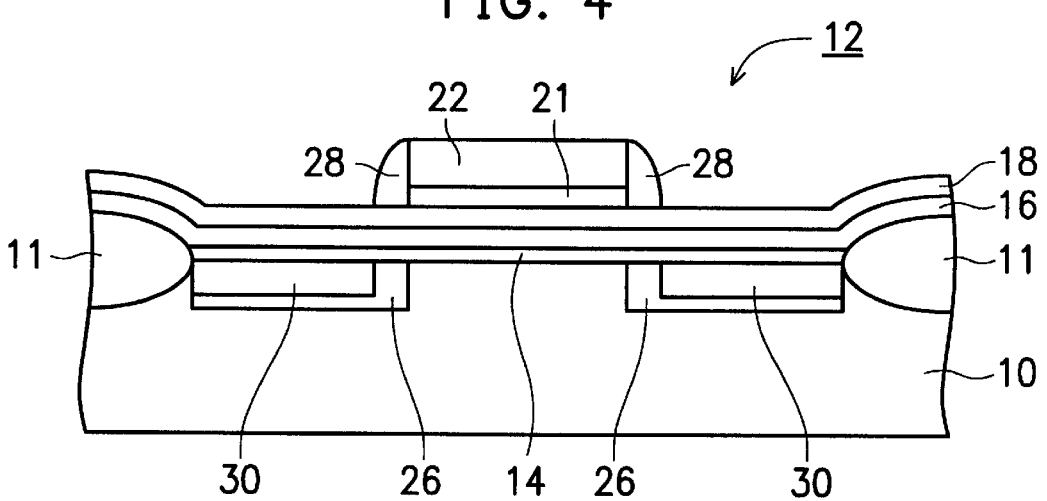
FIG. 5 schematically depicts a cross-sectional view of the step of forming lightly-doped layers within the anti-punchthrough layers.

Referring to FIG. 5, while the buffer layer 22 and the first spacers 28 are utilized as masking, impurities are implanted by the second amorphous silicon layer 18 and the first amorphous silicon layer 16 in the anti-punchthrough layers 26 to form the pair of lightly-doped layers 30. Consequently, each of the lightly-doped layers 30 is encircled by the associated anti-punchthrough layers 26. That is the reason why the step shown in FIG. 3 is called the halo implantation. Preferably, the implanted dopant may be arsenic or phosphorus, the energy ranges from about 50 to 200 KeV, and the dosage ranges from about $5\times10^{12}$ to $5\times10^{14}$ cm$^{-2}$, while the junction depth ranges from about 0.05 µm to about 0.20 µm.

Figure 6:
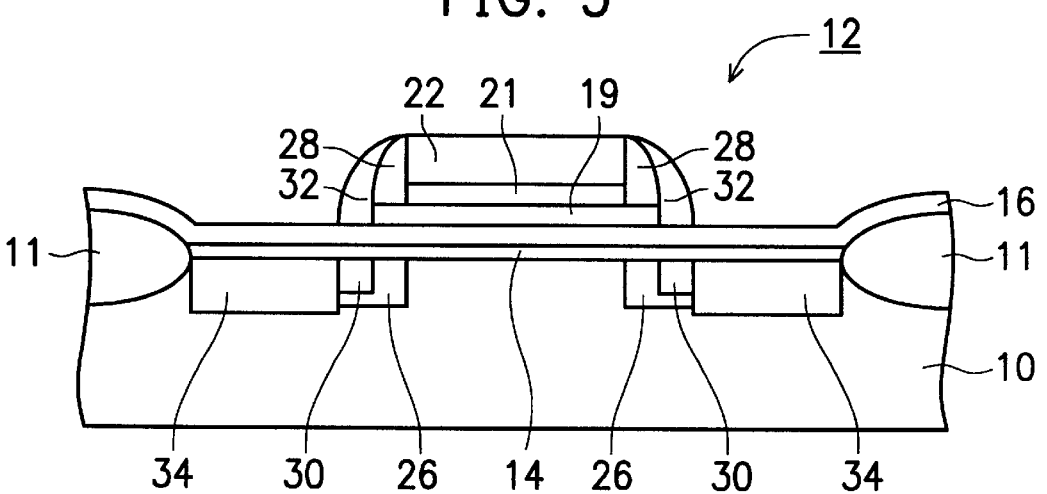
FIG. 6 schematically depicts a cross-sectional view of the steps of forming a second electrode, forming second spacers on the first spacers and sidewalls of the second electrode, and forming heavily-doped layers in the substrate.

Referring to FIG. 6, by using the buffer layer 22 and the first spacers 28 as masking, the second amorphous silicon layer 18 is thereafter patterned and etched to form a second electrode 19. Next, second spacers 32 are formed on the first spacers 28 and the sidewalls of the second electrode 19. The formation of the second electrode 19 utilizes the layer boundary between the first amorphous silicon layer 16 and the second amorphous silicon layer 18 as etching end points. Because the width of the second electrode 19 is greater than that of the first electrode 21, both constitute an inverse-T gate structure. However, the formation of the first spacers 32 implemented by first conformably forming a silicon nitride layer over the substrate 10. Accordingly, the silicon nitride layer is formed on the first amorphous silicon layer 16 and the buffer layer 22 and the first spacers 28, and being simultaneously formed on the sidewalls of the second electrode 19. Subsequently, the silicon nitride layer is subjected to an etching back process to form the second spacers 32 covering on the first spacers 28 and the sidewall of the second electrode 19. Preferably, the etching back process is implemented by reactive ion etching.

Further referring to FIG. 6, while the buffer layer 22 and the second spacers 28 are utilized as masking, impurities are implanted by the first amorphous silicon layer 16 into the substrate 10 to form heavily-doped layers 34. Preferably, the implanted dopant may be arsenic or phosphorus, the energy range from about 20 to 150 KeV, and the dosage range from about $5\times10^{14}$ to $5\times10^{16}$ cm$^{-2}$, while the junction depth ranges from about 0.01 µm to about 0.15 µm.

Figure 7:
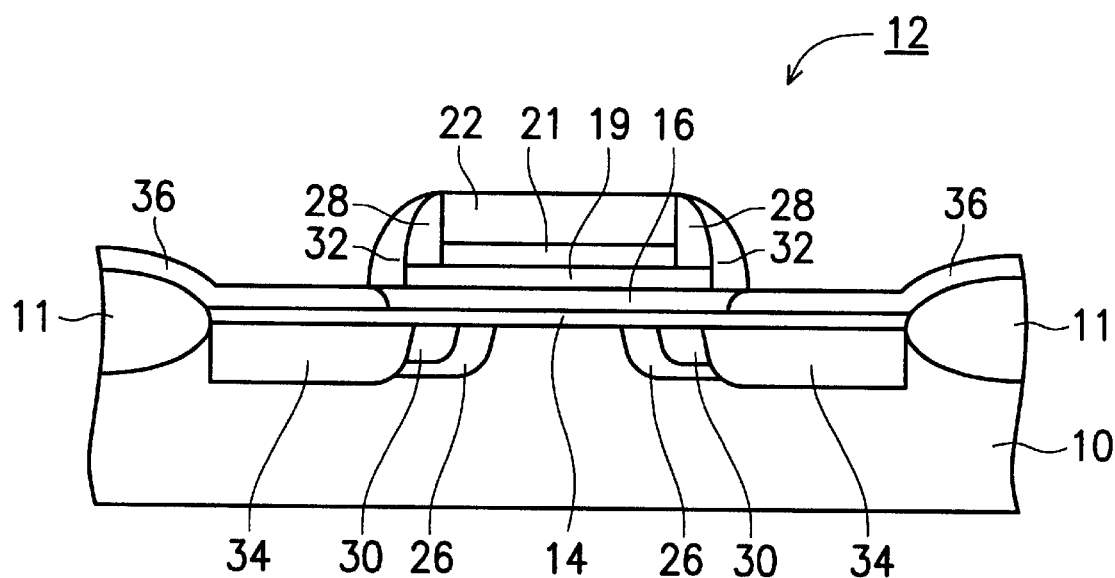
FIG. 7 schematically depicts a cross-sectional view of the step of driving in the lightly-doped layers to be fully covered by the second electrode.

Finally, as shown in FIG. 7, oxidizing the exposed first amorphous silicon layer 16 forms insulating layers 36. Accordingly, the portion positioned above the isolating structures 11 and the heavily-doped layers 34 completely reacts with oxygen to form the insulating layers 36. This oxidation process is performed at a temperature of about 750–1100° C. for about 5–120 minutes in oxygen ambient. Meanwhile, during this thermal cycle, those dopants contained within the anti-punchthrough layers 26, the lightly-doped layers 30 and the heavily-doped layers 34 are activated and driven in. As shown in FIG. 7, all of the anti-punchthrough layers 26, the lightly-doped layers 30 and the heavily-doped layers 34 are laterally diffused. Note that the thermal cycle will continue until at least the lightly-doped layers are fully covered by the second electrode 19.

In conclusion, the present invention makes use of the layer boundaries between two neighboring amorphous silicon layers as etching end points to form the inverse-T gate structure. The lightly-doped drain transistor, fabricated in accordance with the present invention, can prevent hot carrier degradation as well as increase the current drive capability since that the lightly-doped layers are fully covered by the second electrode. Moreover, the use of the high dielectric spacers can dampen the gate-induced drain leakage effect.

The foregoing description of preferred embodiments of the present invention has been provided for the purposes of illustration and description. It is not intended to be exhaustive or to limit the invention to the precise forms disclosed. Many modifications and variations will be apparent to practitioners skilled in the art. The embodiments were chosen and described to best explain the principles of the invention and its practical application, thereby enabling others skilled in the art to understand the invention to practice various other embodiments and make various modifications suited to the particular use contemplated. It is intended that the scope of the invention be defined by the following claims and their equivalents.

What is claimed is:

1. A method of fabricating a lightly-doped drain transistor, comprising the following steps of:

providing a silicon substrate;

forming a gate oxide layer overlying said substrate;

sequentially forming a first amorphous silicon layer, a second amorphous silicon layer, and a third amorphous silicon layer over said gate oxide layer;

forming a buffer layer on a predetermined portion of said third amorphous silicon layer;

forming anti-punchthrough layers in said substrate by using said buffer layer as masking;

etching said third amorphous silicon layer to form a first electrode by using said buffer layer as masking;

forming first spacers on sidewalls of said buffer layer and said first electrode;

forming lightly-doped layers in said associated anti-punchthrough layers by using said buffer layer and said first spacers as masking;

etching said second amorphous silicon layer to form a second electrode by using said buffer layer and said first spacers as masking to expose a portion of said first amorphous silicon layer;

forming second spacers overlying said first spacers and sidewalls of said second electrode;

forming heavily-doped layers in said substrate by using said buffer layer and said second spacers as masking; and oxidizing said exposed first amorphous silicon layer to form an oxide layer and driving said lightly-doped layers to fully overlap with said second electrode.

2. The method as claimed in claim 1, wherein said buffer layer comprises a TEOS oxide layer.

3. The method as claimed in claim 1, wherein said first spacers comprise silicon nitride.

4. The method as claimed in claim 1, wherein said second spacers comprise silicon nitride.

5. The method as claimed in claim 1, wherein the step of forming said anti-punchthrough layers is performed by means of an ion implantation process.

6. The method as claimed in claim 1, wherein the step of forming said lightly-doped layers is performed by means of an ion implantation process.

7. The method as claimed in claim 1, wherein the step of forming said heavily-doped layers is performed by means of an ion implantation process.

8. The method as claimed in claim 2, wherein said first spacers comprise silicon nitride.

9. The method as claimed in claim 2, wherein said second spacers comprise silicon nitride.

10. The method as claimed in claim 2, wherein the step of forming said anti-punchthrough layers is performed by means of an ion implantation process.

11. The method as claimed in claim 3, wherein the step of forming said anti-punchthrough layers is performed by means of an ion implantation process.

12. The method as claimed in claim 4, wherein the step of forming said anti-punchthrough layers is performed by means of an ion implantation process.

13. The method as claimed in claim 2, wherein the step of forming said lightly-doped layers is performed by means of an ion implantation process.

14. The method as claimed in claim 3, wherein the step of forming said lightly-doped layers is performed by means of an ion implantation process.

15. The method as claimed in claim 4, wherein the step of forming said lightly-doped layers is performed by means of an ion implantation process.

16. The method as claimed in claim 5, wherein the step of forming said lightly-doped layers is performed by means of an ion implantation process.

17. The method as claimed in claim 2, wherein the step of forming said heavily-doped layers is performed by means of an ion implantation process.

18. The method as claimed in claim 3, wherein the step of forming said heavily-doped layers is performed by means of an ion implantation process.

19. The method as claimed in claim 5, wherein the step of forming said heavily-doped layers is performed by means of an ion implantation process.

20. The method as claimed in claim 6, wherein the step of forming said heavily-doped layers is performed by means of an ion implantation process.

* * * * *